United States Patent [19]

Koji

[11] Patent Number: 4,836,140
[45] Date of Patent: Jun. 6, 1989

[54] PHOTO-CVD APPARATUS
[75] Inventor: Masashi Koji, Tokyo, Japan
[73] Assignee: Hoshin Kagaku Sangyosho Co., Ltd., Tokyo, Japan
[21] Appl. No.: 245,936
[22] Filed: Sep. 16, 1988

Related U.S. Application Data

[63] Continuation of Ser. No. 941,789, Dec. 15, 1986, abandoned.

[30] Foreign Application Priority Data

Dec. 23, 1985 [JP] Japan .................... 60-197957

[51] Int. Cl.$^4$ ............................................ C23C 16/00
[52] U.S. Cl. .................... 118/722; 118/715; 118/719; 118/50.1; 118/620
[58] Field of Search .............. 118/715, 719, 722, 723, 118/50.1, 620

[56] References Cited

U.S. PATENT DOCUMENTS

| 4,500,565 | 2/1985 | Hiramoto | 427/39 |
| 4,503,807 | 3/1985 | Nakayama | 118/725 |
| 4,525,382 | 6/1985 | Sugioka | 427/54.1 |
| 4,534,314 | 8/1985 | Ackley | 118/719 |
| 4,595,601 | 6/1986 | Horioka | 427/53.1 |

FOREIGN PATENT DOCUMENTS 60-52014  3/1985  Japan .
60-128265 7/1985  Japan .

Primary Examiner—Richard Bueker
Attorney, Agent, or Firm—Bauer & Schaffer

[57] ABSTRACT

A photo-CVD (chemical vapor deposition) apparatus is disclosed, in which at least two light transmission plates are used and the light from a light source is introduced into a gas reaction chamber through one of light transmission plates inserted into the chamber to cause the reactions in a reaction gas to thereby deposit a thin film or layer on a substrate located in the gas reaction chamber. In this case, a light transmission plate polluted by the reaction gas is moved to the outside of the chamber, then washed or exchanged with a new one manually or automaticaly while a clean one is inserted into the chamber, so that the photo-CVD process can be carried out continuously without interrupting the irradiation of the light from the light source.

13 Claims, 5 Drawing Sheets

PHOTO-CVD APPARATUS

This is a continuation of Ser. No. 941,789, filed Dec. 15, 1986 now abandoned.

BACKGROUND OF THE INVENTION

1. Field of the Invention

This invention relates generally to a photo-CVD (chemical vapor deposition) apparatus and, more particularly, is directed to a photo-CVD apparatus utilizing a light and a reaction gas to deposit a thin film on a substrate.

2. Description of the Prior Art

FIG. 1 is a partially cross-sectional view illustrating one example of a prior art photo-CVD apparatus of this kind that is disclosed in Japanese laid-open patent application No. 60-53016.

Referring to FIG. 1, there is provided a gas reaction chamber 1 within which a substrate (sample) 2 on which a thin film is to be deposited by the photo-CVD process is supported on a susceptor 3. Upon operation, the substrate 2 is heated by a heater 4. Specifically, a light source 5 which irradiates, for example, ultraviolet rays is located within a light source compartment 6 that is formed on the gas reaction chamber 1. The ultraviolet rays from the light source 5 irradiate the substrate 2 through an ultraviolet ray transmission plate 7 which tightly shields a window opening 7A formed through the gas reaction chamber 1. The reaction gas is introduced through a gas opening 8 to the gas reaction chamber 1 and exhausted to the outside through a gas exhausting opening 9.

FIG. 2 is a partially cross-sectional view similarly illustrating another example of a prior art photo-CVD apparatus that is disclosed in Japanese Laid-Open Patent Application No. 60-30122. In FIG. 2, like parts corresponding to those of FIG. 1 are marked with the same references and will not be described in detail.

In FIG. 2, reference numeral 10 designates a flue for gas through which a gas supplied from a gas introduction opening 11 is sent to the gas reaction chamber 1 through gas nozzles 12 so as to remove a thin film on the plate 7. Reference numeral 13 designates a reflection plate for the light emitted from the light source 5 and located within the compartment 6.

In the photo-CVD reaction chamber 1, the temperature in the chamber 1 is beyond 200° C. even if the pressure therein is the vacuum condition or atmospheric or normal atmospheric condition. Further, the light source 5 is generally made of an electrode discharge tube and this electrode discharge tube 5 is easily affected at its electrode portion by heat. Accordingly, when this electrode discharge tube 5 used as the light source is located within the gas reaction chamber 1, the ambient temperature thereof is raised so high that as shown in FIG. 1, in most cases, the light source 5 is placed within the light source compartment 6 formed outside the gas reaction chamber 1. Also, the gas reaction chamber 1 and the light source compartment 6 are partitioned by the light transmission plate 7 made of material such as a quartz glass or the like and the conditions of the light source compartment 6 are controlled by the forced-cooling system.

In the photo-CVD apparatus shown in FIG. 2, in order to prevent the reaction gas remaining in the gas reaction chamber 1 from being accumulated on the light transmission plate 7 as an undesired film, gas such as $N_2$, Ar, He or the like (this kind of gas is not reacted with the reaction gas and does not absorb the light emitted from the light source 5) is introduced from the gas introduction opening 11 to the light transmission plate 7 so as to blow off the undesired film deposited on the light transmission plate 7. According to this prior art system, however, there is a possibility that because of the temperature within the gas reaction chamber 1, the flow of the gas and the like, the undesired film adheres to the light transmission plate 7 sooner or later and hence the intensity of the light emitted from the light source 5 to the gas reaction chamber 1 is lowered by such undesired film deposited on the light transmission plate 7. There is then a possibility that the photo-CVD process will not be carried out as it is expected originally.

OBJECTS AND SUMMARY OF THE INVENTION

Accordingly, it is an object of this invention to provide an improved photo-CVD apparatus.

It is another object of this invention to provide a photo-CVD apparatus in which without interrupting the irradiation of a light, an undesired film adhering to a light transmission plate can be removed completely.

It is further object of this invention to provide a photo-CVD apparatus which is not limited to the manufacturing process of semiconductor devices but can be applied to a reaction process of a biotechnology industries.

It is still further object of this invention to provide a photo-CVD apparatus in which the light source thereof is not limited to an electrodeless discharge tube but can use lamps which irradiate infrared rays, a short-wavelength light and so on.

It is yet further object of this invention to provide a photo-CVD apparatus in which a polluted light transmission plate may be exchanged with a clean one manually or automatically.

According to one aspect of the present invention, there is provided a photo-CVD (chemical vapor deposition) apparatus comprising:

(a) a gas reaction chamber accommodating therein a substrate and through which a reaction gas flows;

(b) a light source for emitting a light to the substrate to cause a reaction in the reaction gas in the gas reaction chamber, (c) at least two light transmission plates; and (d) means for moving said at least two light transmission plates such that one of the light transmission plates is inserted into the gas reaction chamber to close in air-tight manner a gate opening located between the light source and the substrate, the light from the light source irradiating on the substrate through the light transmission plate inserted.

According to another aspect of the present invention, there is provided a photo-CVD (chemical vapor deposition) apparatus comprising:

(a) a gas reaction chamber accommodating therein a substrate and through which a reaction gas flows;

(b) a light source located in a compartment communicated with the reaction chamber and for emitting a light to the substrate to cause a reaction in the reaction gas in the gas reaction chamber, (c) at least two light transmission plates;

(d) means for carrying the light transmission plates; and (e) means for moving the light transmission plate carrying means such that one of the light transmission plates is inserted into the gas reaction chamber to close in air-tight manner a gate opening located between the light source compartment and the gas reaction chamber, the light from the light source irradiating on the substrate through the light transmission plate inserted.

These and other objects, features and advantages of the present invention will become apparent from the following detailed description of the preferred embodiment that is to be read in conjunction with the accompanying drawings, in which like reference numerals designate like elements and parts.

DESCRIPTION OF THE PREFERRED EMBODIMENTS

Now, the present invention will hereinafter be described in detail with reference to the drawings.

Figure 1:
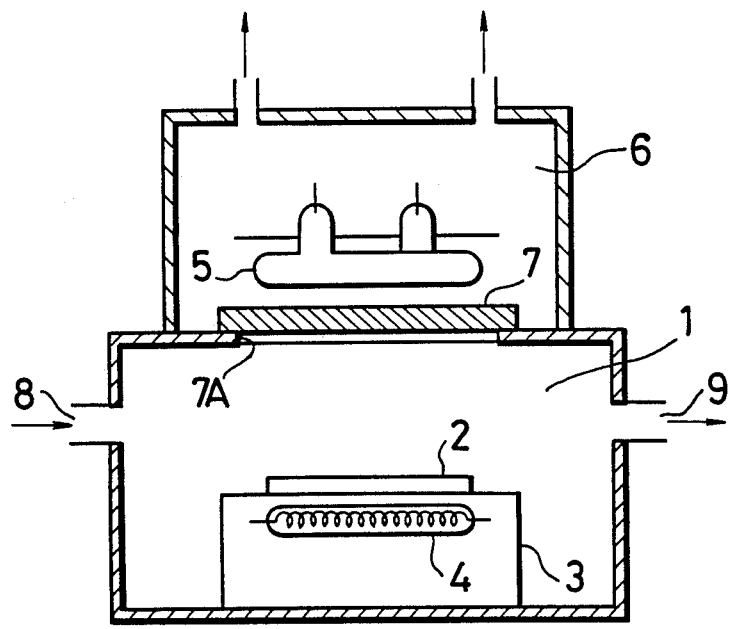
FIG. 1 is a partially cross-sectional view illustrating one example of a prior art photo-CVD (chemical vapor deposition) apparatus.
Figure 3:
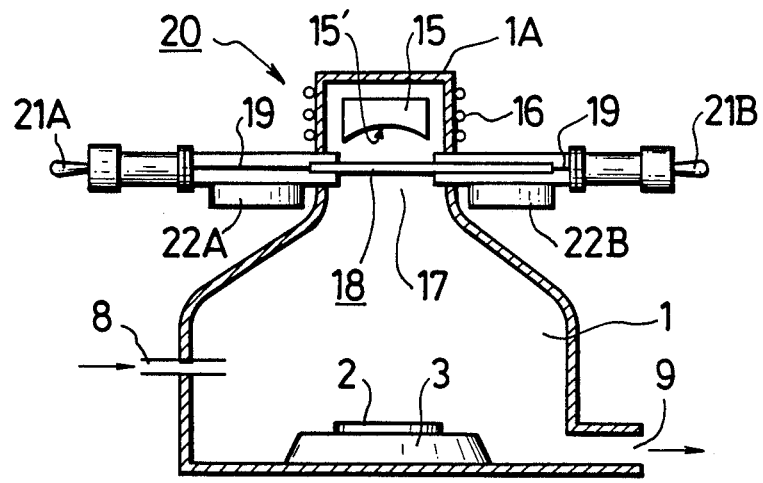
FIG. 3 is a partially cross-sectional view illustrating an embodiment of a photo-CVD apparatus according to the present invention.
Figure 4:
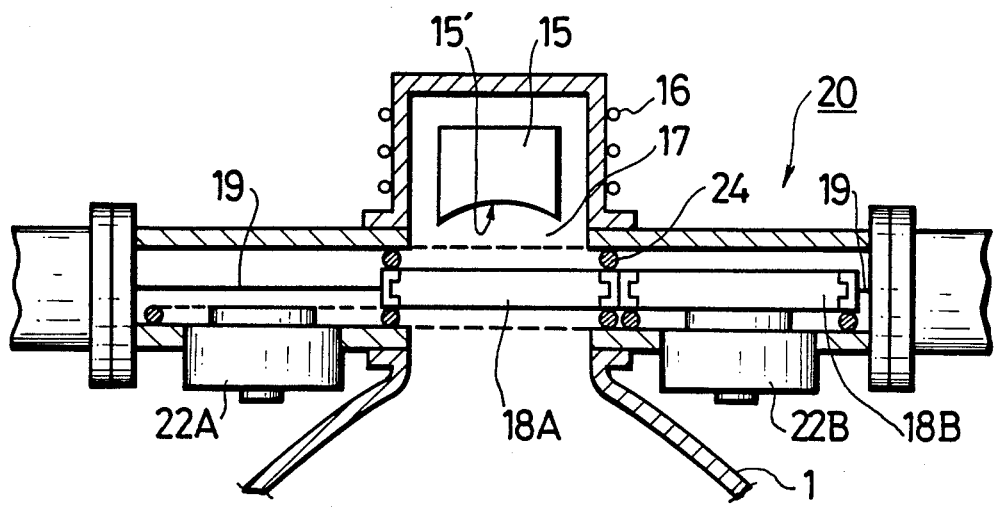
FIG. 4 is a partially enlarged cross-sectional view of a main portion of the photo-CVD apparatus of the invention shown in FIG. 3.

FIG. 3 is a partially cross-sectional view illustrating an embodiment of a photo-CVD apparatus according to the present invention and FIG. 4 is a partially enlarged cross-sectional view of a main portion of the photo-CVD apparatus shown in FIG. 3. In FIGS. 3 and 4, like parts corresponding to those of FIG. 1 are marked with the same references and will not be described in detail.

In FIG. 3, reference numeral 15 designates a light source that is located in the gas reaction chamber 1 at its upper rotation. To be more concrete, this light source 15 is an electrodeless discharge tube in which rare gas or mercury vapor is sealed into a container made of a material such as a quartz glass and the like. This electrodeless discharge tube 15 emits light rays such as ultraviolet rays and so on which cause the photo reaction to occur in the photo-reaction gas introduced to the chamber 1 through the opening 8. The electrodeless discharge tube 15 is long in life span, difficult to be affected by the ambient temperature and flexible to be formed into an arbitrary shape so that the electrodeless discharge tube 15 has an advantage that the uniform irradiation of light can be obtained with ease. Outside a housing 1A of the gas reaction chamber 1, there is provided in response to the electrodeless discharge tube 15 a high frequency winding 16 which is adapted to apply a high frequency electromagnetic field to the electrodeless discharge tube 15 so that the electrodeless discharge tube 15 emits the ultraviolet rays or the like as described above. There is provided a gate opening 17 that is adapted to introduce the light such as the ultraviolet rays from the electrodeless discharge tube 15 to the sample or substrate 2 that is supported on the susceptor 3 within the gas reaction chamber 1. That is, the gate opening 17 is provided within a light gate structure member 18 in facing relation to an irradiation surface 15' of the light source 15. The light gate structure member 18 is formed of integrally two light transmission gate plates 18A and 18B, as shown in FIG. 4. Each of the light transmission gate plates 18A and 18B is made of a material such as a quartz glass and so on. As, for example, shown in FIG. 4, the light gate structure member 18 is attached at its both ends with wires 19 and can be moved in the right or left direction with respect to the gate opening 17 when one of the wires 19 is pulled in the right or left and vice versa. Since the light gate structure member 18 is constructed such that two known gate valves are combined and modified into a composite gate valve, this light gate structure member 18 is hereinafter referred to as a composite gate valve 20. More particularly, this composite gate valve 20 is constructed such that two gate valves each having the gate opening 17 and having the light transmission plate 18A or 18B are coupled together in the right and left with the gate opening 17 common. Reference numerals 21A and 21B designate left and right handles attached to a standard manual type gate valve. The left and right handles 21A and 21B are attached to both ends of the composite gate valve 20, respectively. When, for example, the right handle 21B is turned, the light gate structure member 18 is moved in the right, while when the left handle 21A is turned, the light gate structure member 18 is moved in the left. FIG. 4 shows the state that the light gate structure member 18 is moved in the right and the left light transmission gate plate 18A closes the gate opening 17 in air-tight manner. Further, there are provided washing devices 22A and 22B which are located at both sides of the composite gate valve 20 and outside the gas reaction chamber 1 so as to wash the light transmission gate plates 18A and 18B, respectively. Reference numeral 24 designates seal members that are used to seal the light gate structure member 18 located within the composite gate valve 20. Also, the seal members 24 are used to separate the substrate 2 and the light source 15 within the gas reaction chamber 1 in an air-tight fashion. In this case, the washing device 22A and 22B can wash the light transmission gate plates 18A and 18B by using chemical materials or a plasma discharge process.

Figure 2:
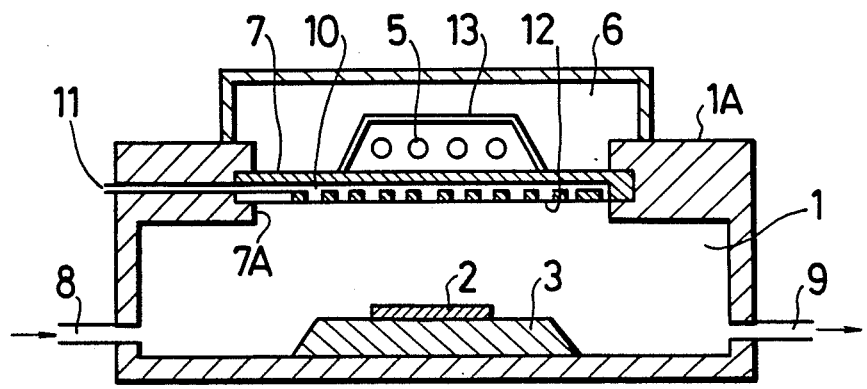
FIG. 2 is a like partially cross-sectional view illustrating another example of the prior art photo-CVD apparatus.

Let it now be assumed that all members of the invention be arranged in the conditions illustrated in FIGS. 3 and 4 and that the light source or electrodeless discharge tube 15 emits the light such as the ultraviolet rays. Then, the light radiated from the electrodeless discharge tube 15 is traveled through the light transmission gate plate 18A and made incident on the substrate 2 held on the susceptor 3 within the gas reaction chamber 1. In this case, the light transmission gate plate 18A serves as a partition plate like the prior art light transmission plate 7 as earlier noted in relation to FIGS. 1 and 2. During the operation, on the under surface of the light transmission gate plate 18A, there will be deposited the undesired product made by the reaction gas introduced to the chamber 1 through the opening 8. At that time, according to the present invention, the left handle 21A is used to shift the light transmission gate plate 18A in the left. Then, the light transmission gate plate 18A is opposed to the left-hand side washing device 22A, while the clean light transmission gate plate 18B is opposed to the gate opening 17. Accordingly, while using the clean light transmission gate plate 18B, the irradiation of light can be carried out continuously and the light transmission gate plate 18A on which the undesired film is deposited can be washed by the left hand-side washing device 22A during that period regardless of the gas reaction chamber 1.

When the undesired film is deposited on the light transmission gate plate 18B, this time, the right handle 21B is used to shift the light transmission gate plate 18B in the right (in the illustrated position). Then, while the irradiation of light is being carried out continuously by using the washed and hence clean light transmission gate plate 18A, the light transmission gate plate 18B is washed by using the washing device 22B. The composite gate valve 20 is not limited to the manual type but it is possible to employ an automatic type composite gate valve.

While the substrate 2 is exemplified as the sample as described above, the present invention is not limited to the manufacturing process of semiconductor devices but can be applied to the reaction process of biotechnology field and so on.

Further, the light source of the invention is not limited to the electrodeless discharge tube but it is possible to use a lamp which emits an infrared ray or a light of a short wavelength. In that case, the high frequency winding 16 in FIGS. 3 and 4 can be omitted.

According to the above embodiment of the photo-CVD apparatus according to the invention, since the light transmission gate plates of the composite gate valve can be alternately washed and used as the light transmission window opening, even if the undesired film is deposited on one of the light transmission gate plates, such polluted light transmission gate plate can be washed and the undesired film thereon can be removed completely without interrupting the irradiation of light.

Figure 5:
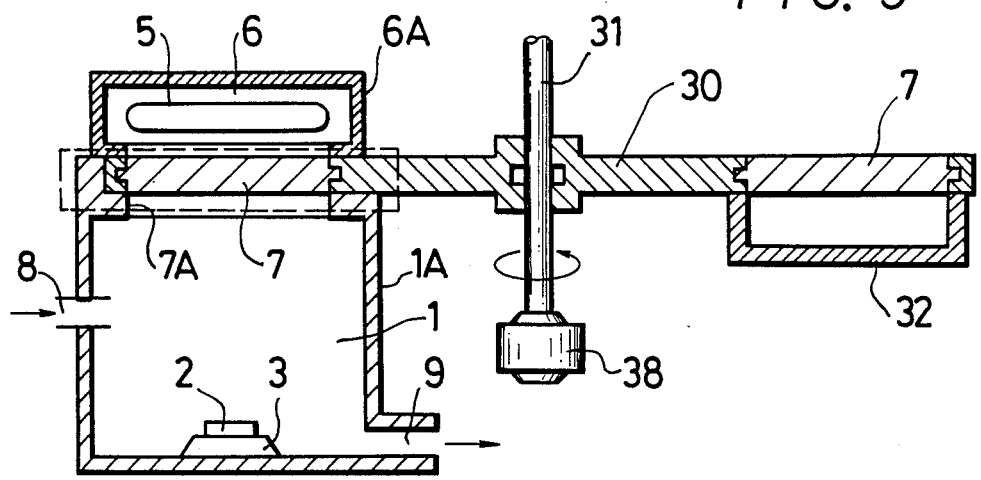
FIG. 5 is a schematic cross-sectional view showing another embodiment of the photo-CVD apparatus according to the present invention.
Figure 6:
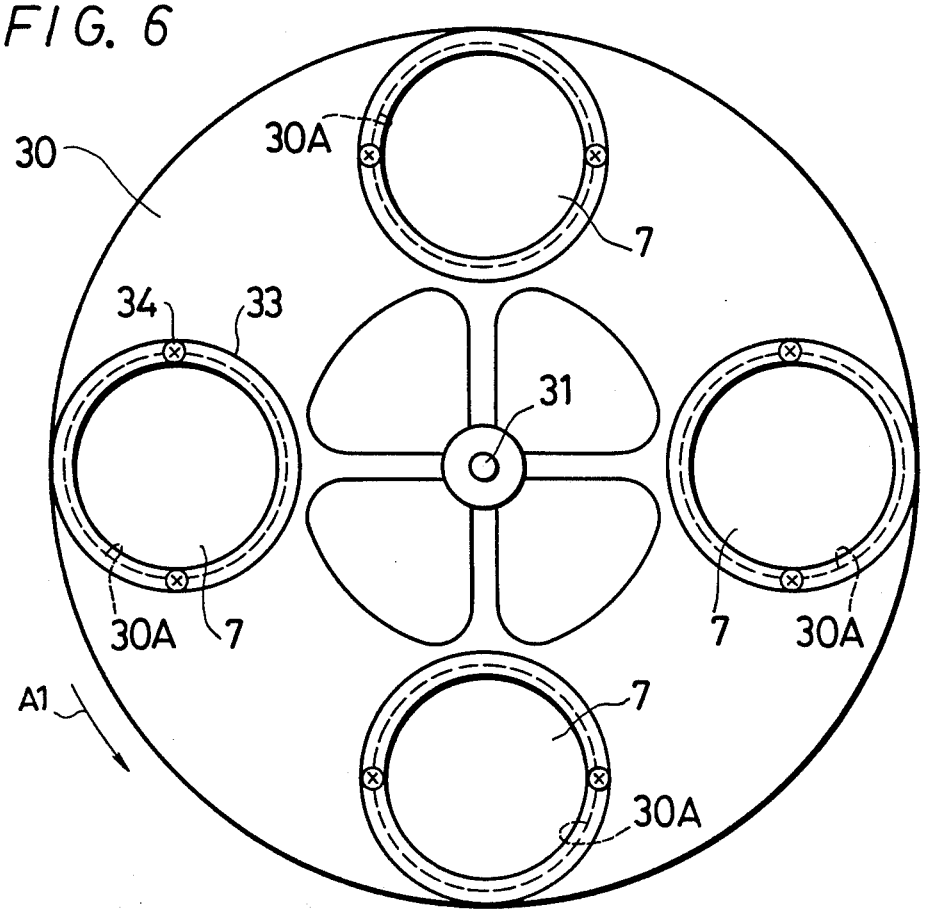
FIG. 6 is a plan view illustrating a main portion of the photo-CVD apparatus shown in FIG. 5.
Figure 7:
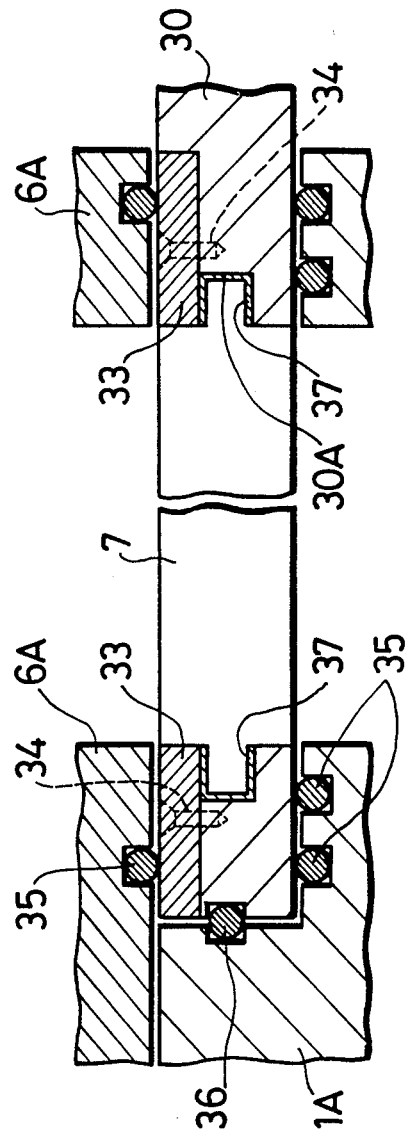
FIG. 7 is an enlarged diagram of a main portion encircled by a broken line in FIG. 5.

FIG. 5 is a schematic cross-sectional view illustrating another embodiment of the photo-CVD apparatus according to the present invention. FIG. 6 is a plan view of a main portion of the photo-CVD apparatus shown in FIG. 5 and FIG. 7 is an enlarged view of a main portion encircled by a broken line in FIG. 5. Throughout FIGS. 5 to 7, like parts corresponding to those in FIG. 1 are marked with the same references and will not be described in detail.

Throughout FIGS. 5 to 7, reference numeral 30 designates a rotary plate which is attached to and rotatably supported by a rotary shaft 31. Reference numeral 32 designates a washing device, 33 a fixed ring, 34 a fixed screw (bolt) and 35 and 36 0-type ring seals, and 37 a packing ring, respectively. The rotary plate 30 is made of plastics, metals or the like and formed as, for example, a disk-shaped member which has bored therethrough a plurality of (four in the illustrative example) openings 30A with, for example, an equal angular distance, for example, 90°. To each of the openings 30A, the light transmission plate 7 is attached by the fixed rings 33 and the fixed bolts 34. The shape of the light transmission plate 7 is determined on the basis of the structure of the light-irradiated portion or window opening 7A within the gas reaction chamber 1 and in the illustrated example, the light transmission plate 7 is formed as a circular-shaped member, by way of example. The rotary plate 30 is arranged so as to be rotatable around the rotary shaft 31 by proper rotation driving means 38 such as a motor or the like.

As shown in FIG. 7, one of 0-type ring seals 35 is provided between the upper surface of the fixed ring 33 for fixing the light transmission plate 7 to the opening 30A of the rotary plate 30 and a casing 6A of the light source compartment 6, and the other 0-type ring seal 35 is located between the lower surface of the rotary plate 30 and the casing 1A of the chamber 1, while the 0-type ring seal 36 is inserted between the surrounding of the rotary plate 30 and the casing 1A of the gas reaction chamber 1. The packing ring 37 is inserted between the light transmission plate 7 and the opening 30A of the rotary plate 30 so as to maintain the air-tightness therebetween.

Let it now be assumed that the light transmission plate 7 on the left-hand side of the rotary plate 30 in FIGS. 5 and 6 be used and that the surface of the light transmission plate 7 facing to the gas reaction chamber 1 is polluted by the photo reaction gas. Then, the rotary plate 30 is rotated in the predetermined direction, for example, in the counter-clockwise direction A1 by a predetermined angle, for example, 90° in this example, and the polluted light transmission plate 7 is exchanged with a light transmission plate 7 that was already washed. At this time, another clean light transmission plate 7 is located to close the window opening 7A in the chamber 1. The washing device 32 may wash the polluted light transmission plate 7 by using chemical materials or a plasma discharge process similarly as mentioned before. While the washing device 32 is located at the position corresponding to the light transmission plate 7 placed at the right-hand side of FIGS. 5 and 6, the washing device 32 may be located at the position corresponding to the upper or lower light transmission plate 7 in FIG. 6. In this case, the gas reaction chamber 1 same in construction as that located in the left-hand side can be placed at the right-hand side of FIG. 6. Accordingly, without introducing the air into the gas reaction chamber 1, that is, without interrupting the irradiation of light, the undesired layer deposited on the light transmission plate 7 is washed off sequentially and the light transmission plate can be prepared for the next use.

While four light transmission plates 7 are attached to four openings 30A of the rotary plate 30 with an equal angular spacing, 90° as described above in FIG. 6, it is possible that the number of the light transmission plates 7 is increased and so, for example, eight light transmission plates 7 are attached to the rotary plate 30 with the equal angular spacing thereamong.

Further, the shapes of the rotary plate 30 and of the light transmission plates 7 are not always limited to the circular-shaped ones but can be modified variously.

Further, the light transmission plate which is moved to the outside of the gas reaction chamber 1 may be removed, washed by a washing device located in other place and then attached again to the rotary plate 30.

Figure 8:
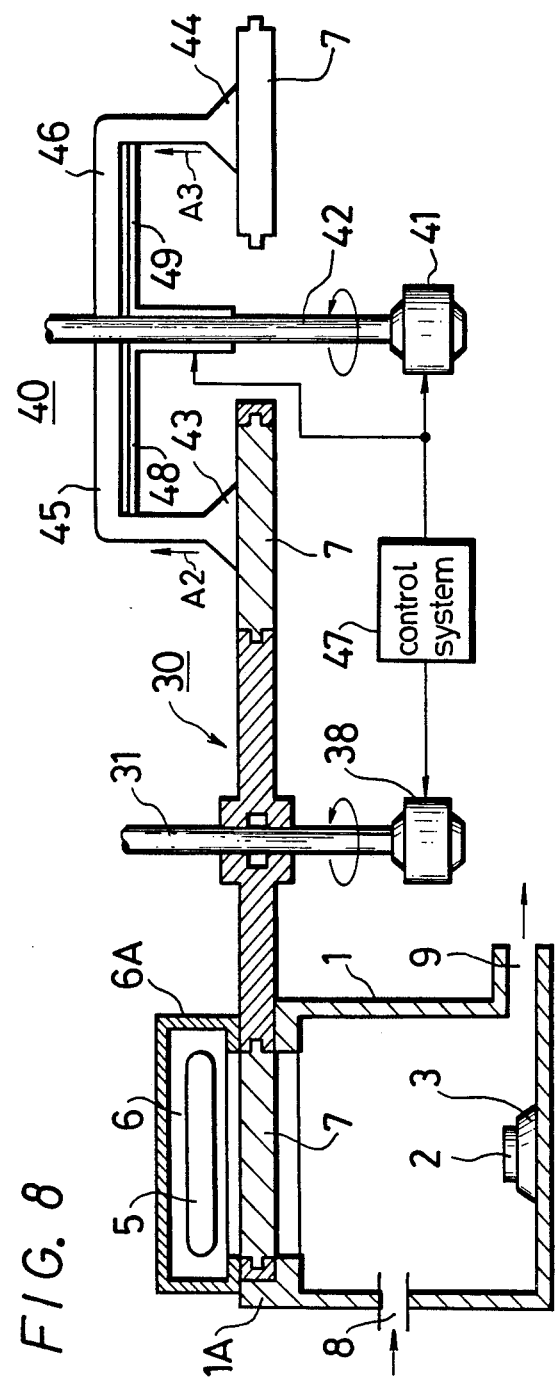
FIG. 8 is a partially cross-sectional side view of further embodiment of the photo-CVD apparatus according to the present invention.
Figure 9:
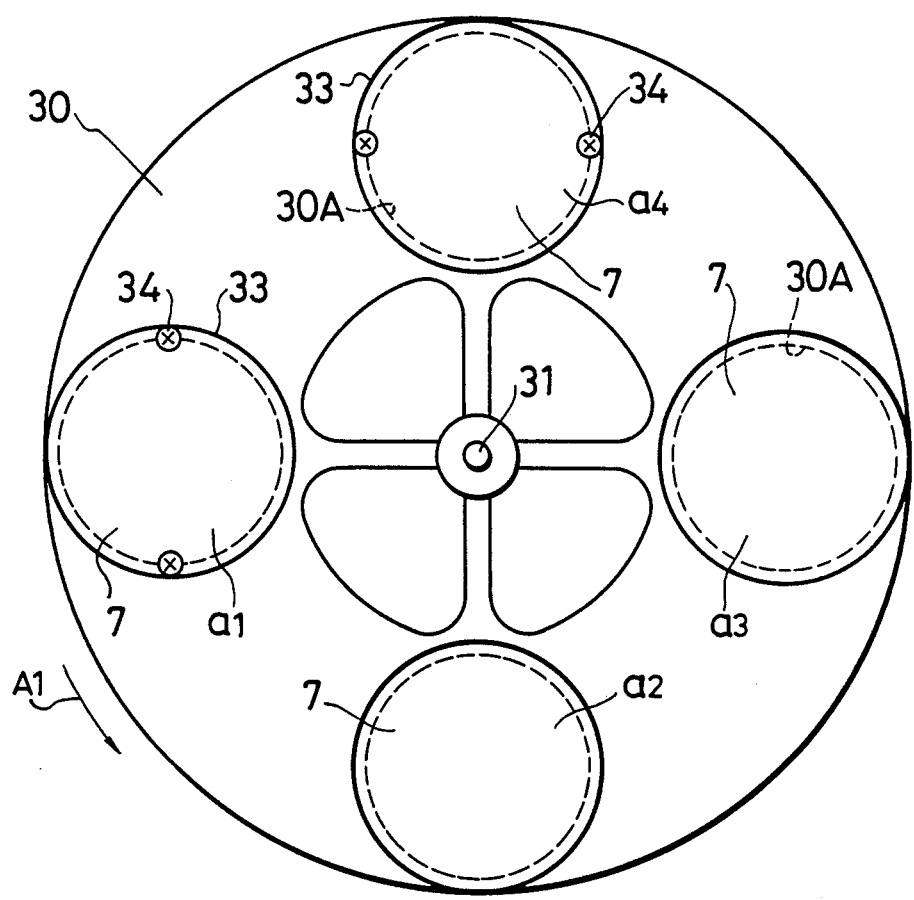
FIG. 9 is a plan view illustrating a main portion of the photo-CVD apparatus shown in FIG. 8.

Alternatively, the polluted light transmission plate 7 may be removed and exchanged with a clean light transmission plate. This version will be described with reference to FIGS. 8 and 9. In FIGS. 8 and 9, like parts corresponding to those in FIGS. 5, 6 and 7 are marked with the same references and will not be described in detail.

Referring to FIG. 9, when the light transmission plate 7 at the position shown at a1 is used and then polluted, similarly to the preceding embodiment, the rotary plate 30 is rotated in the direction shown, for example, by an arrow A1, by 90° in the illustrated embodiment and the polluted light transmission plate 7 is moved up to a position a2. At the position a2, the fixed ring 33, the bolts 34 and so on are removed from the polluted light transmission plate 7 and at that time, if the light transmission plate 7 that is being used, that is, the light transmission plate 7 placed at the position a1 is polluted, the rotary plate 30 is further rotated by 90° in the direction shown by the arrow A1. Then, at the position a3, the polluted light transmission plate 7 is exchanged with a clean light transmission plate 7. At that time, the fixed ring 33, the bolts 34 and so on in the polluted light transmission plate 7 at the position a2 are removed therefrom. At that time, if the light transmission plate 7 that is now being used is polluted, the rotary plate 30 is rotated further by 90° in the direction shown by the arrow A1 and at a position a4, the new light transmission plate 7 is fixed to the rotary plate 30 in the air-tight condition by using the fixed ring 33, the bolts 34 and so on. At that time, at the position a3, the polluted light transmission plate 7 is exchanged with a clean light transmission plate 7 and the fixed ring 33, the bolts 34 and so on are removed from the light transmission plate 7 that is located at the position a2. The similar operation will be carried out repeatedly and hence the light transmission plate 7 located at the position a1 is always clean one.

In this case, while the polluted light transmission plate 7 is exchanged with the clean light transmission plate 7 at the position a3 manually, this exchange operation can be carried out automatically by utilizing exchanging device 40 which utilizes a vacuum mechanism as, for example, shown in FIG. 8. That is, this exchange device 40 is formed such that a pair of vacuum chucks 43 and 44, for example, are attached to a rotary shaft 42 rotatable by a motor 41 or the like at the positions distant from each other by, for example, 180° through a pair of arm members 45 and 46. When one vacuum chuck 43 absorbs and lifts up the polluted light transmission plate 7 at the position a3 in the direction shown by an arrow A2, the other vacuum chuck 44 absorbs and lifts up the clean light transmission plate 7 in the direction shown by an arrow A3. Then, the motor 41 rotates the rotary shaft 42 by 180° and then the vacuum chuck 44 reaches to the a3 position of the rotary plate 30 and the vacuum chuck 43 reaches to the position different by 180°. Then, if the vacuum chucks 43 and 44 are made inoperative at that position, the clean light transmission plate 7 is placed on the rotary plate 30, while the polluted light transmission plate 7 is placed at the position of the clean light transmission plate before being exchanged in which the polluted light transmission plate 7 is cleaned or exchanged by other clean light transmission plate 7.

While the vacuum chucks 43 and 44 are made distant from each other with the spacing of 180° therebetween with respect to the rotary shaft 42 as described above, it is sufficient that if both the light transmission plates 7 lifted up by the vacuum chucks 43 and 44 may become distant from each other with a proper spacing and will not contact with the rotary plate 30, the spacing therebetween may be 90° and so on.

Further, when a time period during which the light transmission plate 7 is used in practice is considered, it is sufficient to use one of the vacuum chucks 43 and 44. In other words, the polluted light transmission plate 7 at the position a3 is lifted up by one vacuum chuck and then moved to other position and the clean light transmission plate 7 may be lifted up by the same vacuum chuck and loaded onto the rotary plate 30 at the position a3.

When the rotary plate 30 is rotated periodically, if the motor 41 of the exchange device 40 is driven and its absorbing operation is carried out in association with the driving of the motor 38 through a control system 47 (refer to FIG. 8), the exchange of the light transmission plates 7 can be carried out automatically.

In FIG. 8, reference numerals 48 and 49 designate pipes which are communicated at one ends with the vacumn chucks 43 and 44 and also communicated at the other ends with a vacumn pump (not shown), respectively.

According to the above latter embodiment of the present invention as set forth above, there can be achieved the following remarkable effects.

Merely by rotating the rotary plate with a plurality of the light transmission plates attached thereon, the light transmission plate polluted can be exchanged with the clean light transmission plate with ease.

Since the exchange operation of the light transmission plates is carried out without changing the condition in the gas reaction chamber, it is not necessary to interrupt the irradiation of the light.

Further, since the rotary plate is rotated regularly, the polluted condition, the deterioration of the light transmission plate and so on can be checked with ease from the outside of the gas reaction chamber.

The above description is given on the preferred embodiments of the invention but it will be apparent that many modifications and variations could be effected by one skilled in the art without departing from the scope or novel concepts of the invention so that the scope of the invention should be determined by the appended claims only.

I claim as my invention:

1. A photo-CVD (chemical vapor deposition) apparatus comprising:
   (a) a gas reaction chamber accommodating therein a substrate and through which a reaction gas flows, said gas reaction chamber having a gate opening in one wall thereof;
   (b) a light source communicating with said reaction chamber through said gate opening and for emitting a light to said substrate to cause a reaction in said reaction gas in said gas reaction chamber,
   (c) at least two light transmission plates;
   (d) means for carrying said light transmission plates;
   (e) means for indexing said carrying means between a first position with said gas chamber such that one of said light transmission plates is inserted into said gas reaction chamber to close in air-tight manner said gate opening while permitting said light source to pass into said gas reaction chamber to irradiate said substrate and a second position such that at least one of the other of said light transmission plates is exterior of said gas reaction diameter; and
   (f) means located exterior of said gas reaction chamber including vacuum means for automatically removing said other polluted plate from said carrying means at said second position and for supplying to said carrying means a non-pollution plate to replace it with a new and clean light transmission plate.

2. A photo-CVD apparatus as claimed in claim 1, in which each of said light transmission plates is formed as a disc-shaped member.

3. A photo-CVD apparatus as claimed in claim 2 in which said light source is located in a compartment arranged about said gate opening and said disc shaped members forming said transmission plates are mounted on a rotary carrying plate, said rotary carrying plate and said light source compartment are sealed in air-tight fashion through an O-type ring seal.

4. A photo-CVD apparatus as claimed in claim 3, in which said rotary carrying plate and said gas reaction chamber are sealed in air-tight fashion through an O-type ring seal.

5. A photo-CVD apparatus as claimed in claim 1, in which said light transmission plate is mounted within said rotary carrying plate in air-tight condition by a packing ring.

6. A photo-CVD apparatus as claimed in claim 1, in which the number of said light transmission plates is four or eight.

7. A photo-CVD apparatus as claimed in claim 6, in which said light transmission plates are located with an equal angular distance.

8. A photo-CVD apparatus as claimed in claim 1, in which said light transmission plate is made of a quartz glass.

9. A photo-CVD apparatus according to claim 1 wherein said exchange means is automatic.

10. A photo-CVD apparatus as claimed in claim 9, in which said automatic exchange means is formed of a pair of vacuum chuck means for lifting up said light transmission plates, a rotary shaft to which said vacumn chucks are attached, a pair of arm members for connecting said pair of vacuum chuck means to said rotary shaft and a drive motor for rotating said rotary shaft.

11. A photo-CVD apparatus as claimed in claim 9, in which a spacing between said pair of vacuum chuck means is selected as 180°.

12. A photo-CVD apparatus as claimed in claim 11, in which said spacing between said pair of vacuum chuck means is selected as 90°.

13. A photo-CVD apparatus according to claim 9 further comprising means for driving said light transmission plate carrying means and said exchange means in corresponding relation.

* * * * *